United States Patent
Umeda et al.

[11] Patent Number: 5,949,403
[45] Date of Patent: Sep. 7, 1999

[54] REMOTE COORDINATE DESIGNATING DEVICE

[75] Inventors: Yuichi Umeda; Masatoshi Uchio; Tomomitsu Muta, all of Fukushima-ken; Junichi Saito, Miyagi-ken; Masahiro Tanaka, Fukushima-ken, all of Japan

[73] Assignee: Alps Electric Co., Ltd., Japan

[21] Appl. No.: 08/565,659

[22] Filed: Nov. 29, 1995

[30] Foreign Application Priority Data

Nov. 30, 1994 [JP] Japan ................................ 6-296998
Nov. 30, 1994 [JP] Japan ................................ 6-296999

[51] Int. Cl.[6] .................................................. G09G 5/08
[52] U.S. Cl. ...................................... 345/157; 345/158
[58] Field of Search .................................. 345/156, 157, 345/158, 166, 169; 348/734; 340/825.72, 825.57, 825.69

[56] References Cited

U.S. PATENT DOCUMENTS

4,745,402  5/1988  Auerbach ............................ 345/158
5,351,096  9/1994  Park ..................................... 348/734
5,554,980  9/1996  Hashimoto et al. ................. 345/158
5,627,565  5/1997  Morishita ............................. 345/158

*Primary Examiner*—Chanh Nguyen
*Attorney, Agent, or Firm*—Brinks Hofer Gilson & Lione

[57] ABSTRACT

A remote coordinate designating device has a remote control with a light emitting device for emitting light, and a controller for detecting a designated position by receiving light from the remote control at a distance from the remote control. One cycle of a light signal from the light emitting device is composed of switch data and a coordinate detection timing header at the head, and a coordinate detection carrier. The switch data and the coordinate detection timing header use the same frequency as the normal remote control frequency band, and the frequency of the coordinate detection carrier is lower than the frequency of the switch data and the coordinate detection timing header. The switch data contains on-off information about a switch for pointing, and coordinate detection is started when a predetermined time has passed from the rise of a burst portion in the switch data.

5 Claims, 8 Drawing Sheets

FIG. 9A
LIGHT SIGNAL EMITTED FROM REMOTE CONTROL

FIG. 9B
SWITCH DATA AND COORDINATE DETECTION TIMING HEADER

FIG. 9C
COORDINATE DETECTION CARRIER

FIG. 10

REMOTE COORDINATE DESIGNATING DEVICE

BACKGROUND OF THE INVENTION

1. Field of the Invention

The present invention relates to a remote coordinate designating device which intuitively moves a cursor by spatially moving at a distance and which is also used as a remote control.

2. Description of the Prior Art

As a typical of remote coordinate designating device, a cross cursor key and a ball pointing device added to a remote device (remote control) are well known. Furthermore, a controller with a joy stick, a plane coordinate input device having a matrix of switching elements and the like are mainly used.

The above-mentioned cross cursor key and the like added to the remote device offers only a stepwise display of a cursor, and moves the cursor only in the horizontal and vertical directions.

In the ball pointing device, a direct operation feeling cannot be obtained in moving the cursor, and the cursor is difficult to move.

SUMMARY OF THE INVENTION

A first object of the present invention is to provide a remote coordinate designating device which makes it possible to increase the accuracy of data sent out from a remote control and to thereby enhance operability with no danger of an erroneous operation.

A second object of the present invention is to provide a remote coordinate designating device which can reliably detect the coordinate position of a remote control even when a plurality of transmission modes are used.

A third object of the present invention is to provide a remote coordinate designating device which achieves a wide half-value angle of a light pattern of a light emitting device, high light intensity, a wide usable area, a wide detection angle range, and good linearity of movements of a cursor and a remote control.

A fourth object of the present invention is to provide a remote coordinate designating device which causes no winding in the detection angle characteristic curve at a use angle normally used by an operator even if there are variations in light patterns of light emitting devices, and which achieves a good linearity of the movement of a cursor in response to the movement of a remote control, an improved yield of products and improved operability.

The above first object is achieved by a first means comprising a remote control having a light emitting device for emitting light, and a controller for detecting a designated position by receiving light from the remote control at a distance from the remote control, wherein one cycle of a light signal from the light emitting device is composed of switch data and a coordinate detection timing header at the head, and a coordinate detection carrier, the switch data and the coordinate detection timing header use the same frequency as the normal remote control frequency band, the frequency of the coordinate detection carrier is lower than the frequency of the switch data and the coordinate detection timing header, the switch data contains on-off information about a switch for pointing, and coordinate detection is started when a predetermined time has passed from the rise of a burst portion in the switch data.

The above second object is achieved by a second means comprising a remote control having a light emitting device for emitting light, and a controller for detecting a designated position by receiving light from the remote control at a distance from the remote control, wherein an angle detection signal and a remote control code signal are transmitted from the remote control, and the controller comprises a processing circuit for the remote control code signal, a processing circuit for the angle detection signal, and a CPU for controlling both the signals.

The above second object is achieved by a third means included in the second means, wherein, an output having a waveform corresponding to switch data and a coordinate detection timing header can be obtained in the processing circuit for the remote control code signal by making a second variable gain amplifier detect an output signal for itself and bring it to a fixed level, taking out only a remote control code of the remote control frequency band by a second bandpass filter, and detecting the code by a detector, and passing the code through a low-pass filter and a second waveform shaping device, and, in the processing circuit for the angle detection signal, the angle detection signal is proportionally converted into a current value depending on the light intensity by a photoreceptor, the current is converted into voltage by a variable gain I/V device, an output of the variable gain I/V device is input to a first variable gain amplifier, and only a coordinate detection carrier is passed through a first bandpass filter and input to the CPU.

The above third object is achieved by a fourth means comprising a remote control having a light emitting device for emitting light, and a controller for detecting a designated position by receiving light from the remote control at a distance from the remote control, wherein the remote control comprises a center light emitting device located in the center, and upper, lower, right and left light emitting devices arranged around the center light emitting device and tilted in such directions that the optical axes thereof extend away from the center light emitting device.

The above third object is achieved by a fifth means included in the fourth means, wherein the center light emitting device and the right light emitting device are paired, the center light emitting device and the left light emitting device are paired, the center light emitting device and the upper light emitting device are paired, the center light emitting device and the lower light emitting device are paired, and these four pairs of light emitting devices are lighted alternately.

The above fourth object is achieved by a sixth means included in the fourth means, wherein the half-value angle of the center light emitting device is equal to or smaller than the half-value angles of the right, left, upper and lower light emitting devices.

In the above first means, since the accuracy of data transmitted from the remote control can be enhanced, there is no danger of an erroneous operation, and therefore, operability is enhanced.

In the above second and third means, the coordinate position of the remote control can be detected reliably even when a plurality of transmission modes are used.

In the fourth and fifth means, since a wide half-value angle of the light pattern and high light intensity can be achieved, the usable area and the detection angle range can be made wide.

In the sixth means, since no winding arises in the detection angle characteristic curve at a use angle normally used by an operator even if there are variations in light patterns of light emitting devices, good linearity of the cursor movement in response to the movement of the remote control can be maintained, the yield of products is enhanced, and operability is also enhanced.

DESCRIPTION OF THE PREFERRED EMBODIMENTS

Embodiments of the present invention will now be described with reference to the drawings.

Figure 1:
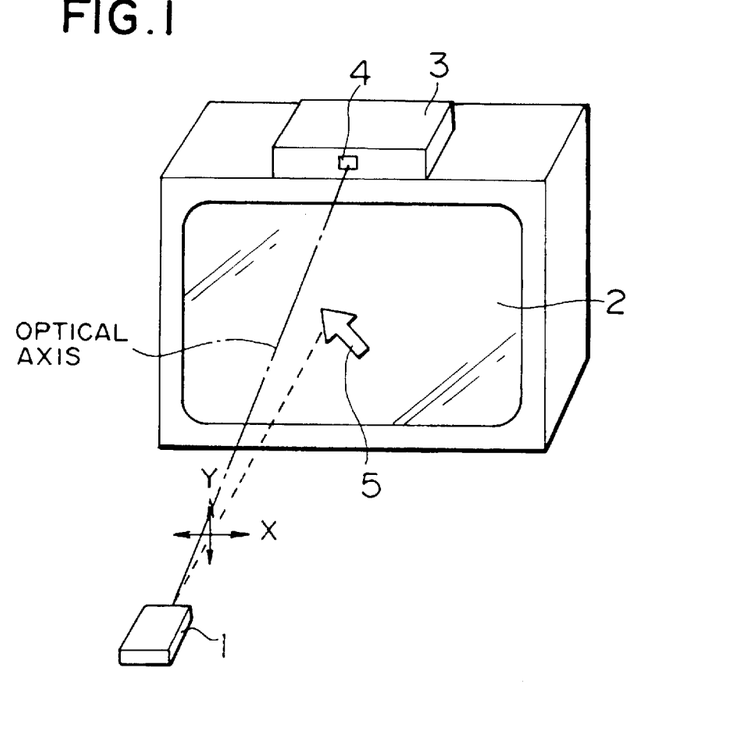
FIG. 1 is an explanatory view showing the concept of a remote coordinate designating device according to the present invention.
Figure 2:
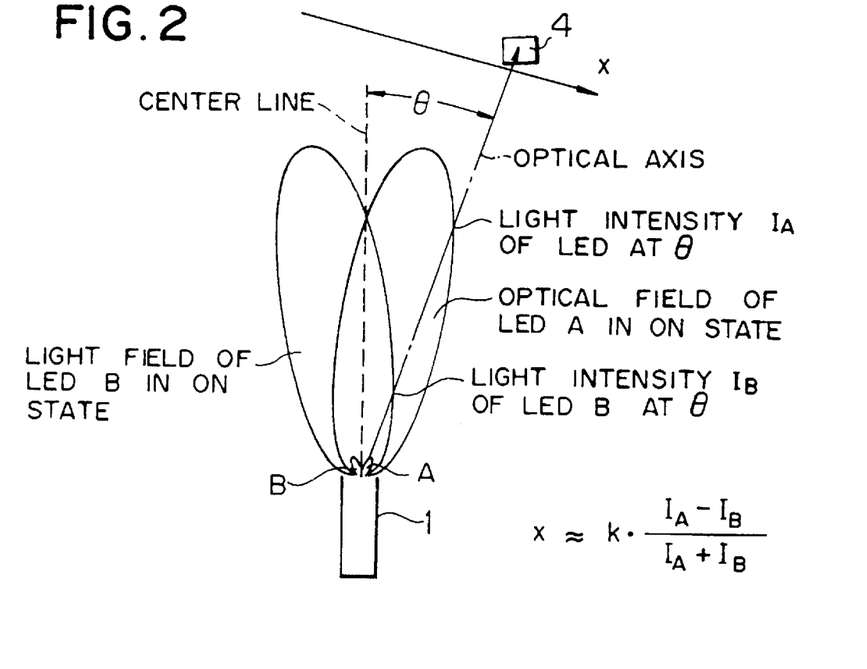
FIG. 2 is an explanatory view showing the principle of angle detection in the remote coordinate designating device according to the present invention.
Figure 3A:
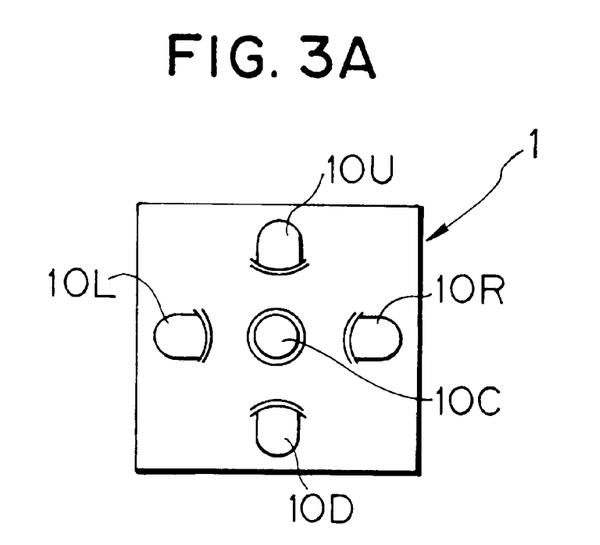
FIGS. 3A, 3B and 3C are explanatory views showing the arrangement of light emitting devices in a remote coordinate designating device according to a first embodiment of the present invention.
Figure 3B:
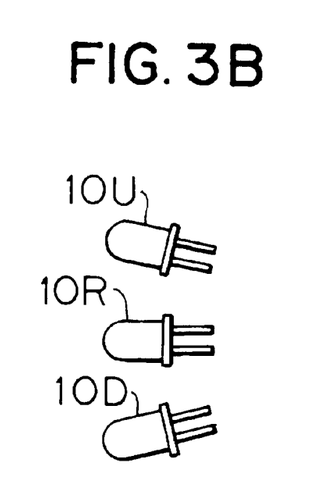
Figure 3C:
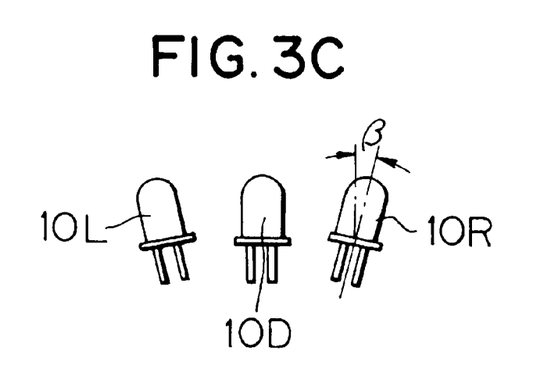
Figure 4:
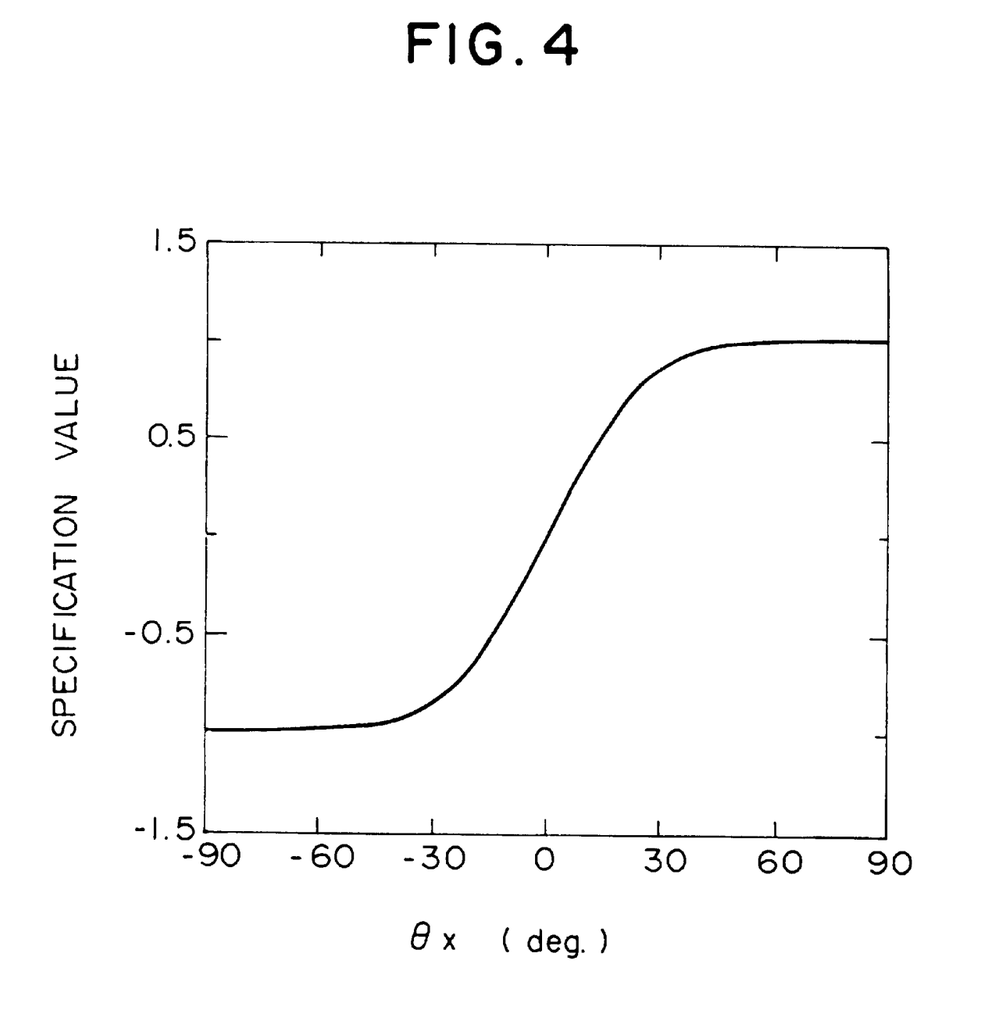
FIG. 4 is a detection angle characteristic curve according to light patterns of the remote coordinate designating device according to the present invention.
Figure 5:
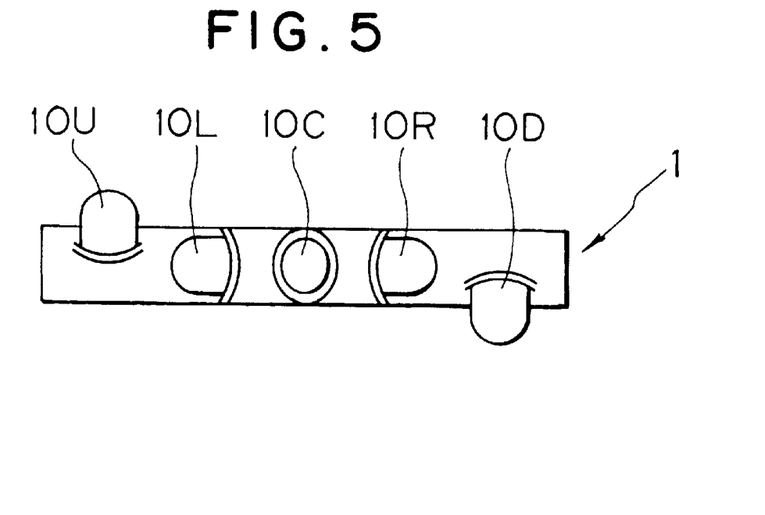
FIG. 5 is an explanatory view showing the arrangement of light emitting devices in a remote coordinate designating device according to a second embodiment of the present invention.
Figure 6A:
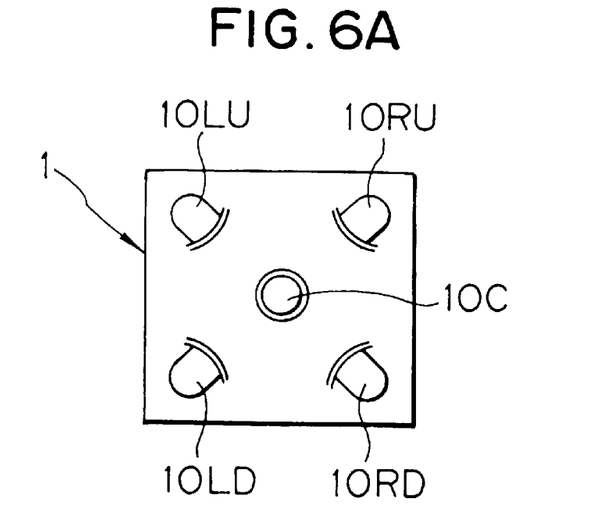
FIGS. 6A, 6B and 6C are explanatory views showing the arrangement of light emitting devices in a remote coordinate designating device according to a third embodiment of the present invention.
Figure 6B:
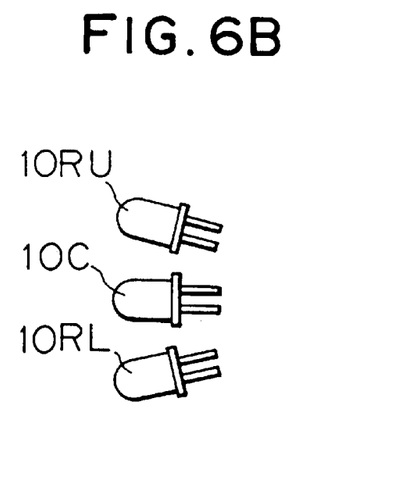
Figure 6C:
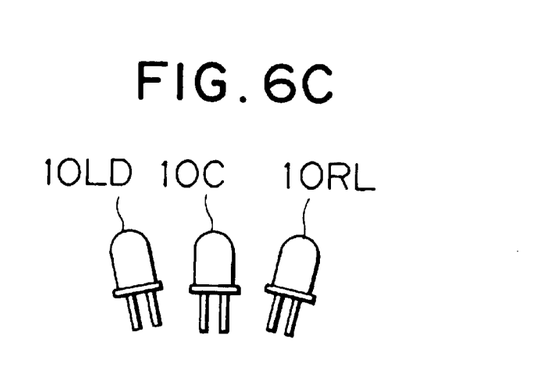
Figure 7:
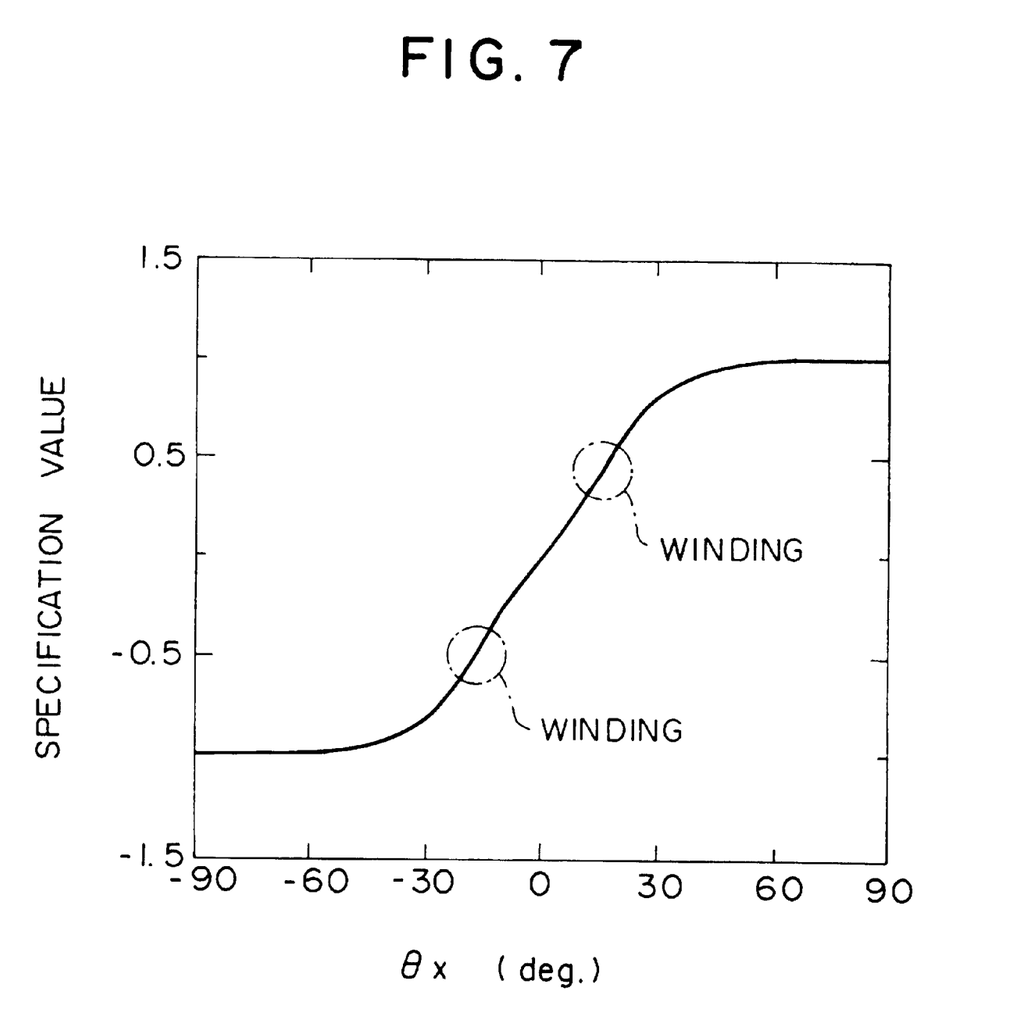
FIG. 7 is a detection angle characteristic curve in a case in which the half-value angle of the center light emitting device is wider than that of other light emitting devices in the remote coordinate designating device according to the first embodiment of the present invention.
Figure 8:
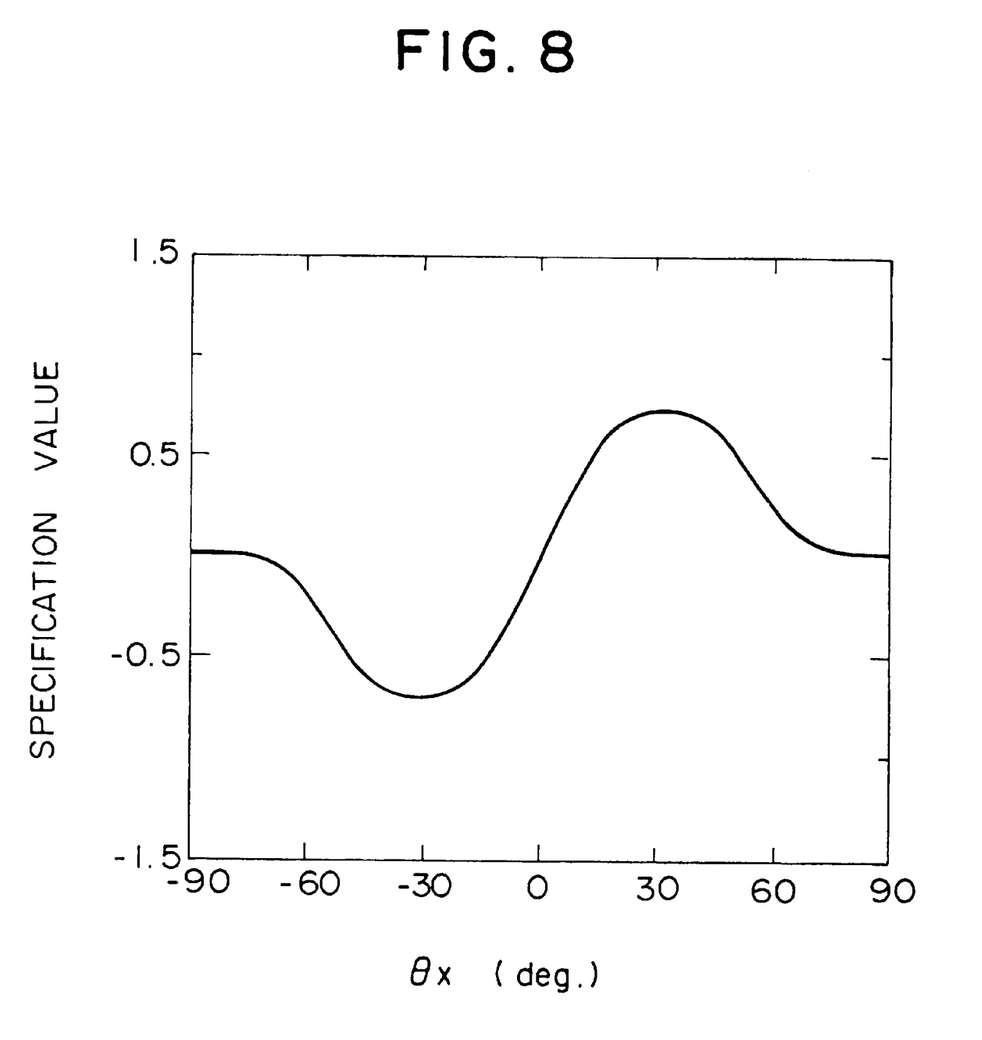
FIG. 8 is a detection angle characteristic curve in a case in which the half-value angle of the center light emitting device is narrower than that of other light emitting devices in the remote coordinate designating device according to the first embodiment of the present invention.
Figure 9A:
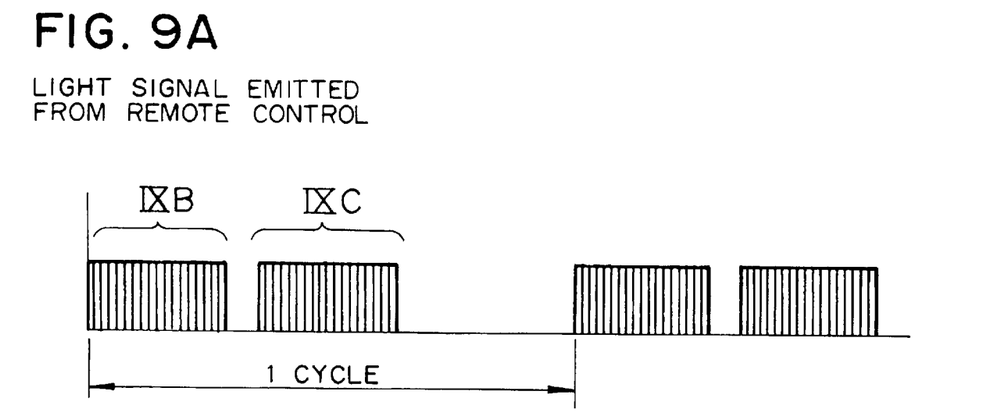
FIGS. 9A, 9B and 9C are waveform charts respectively showing the whole format of a signal from a remote control in the remote coordinate designating device of the present invention, switch data and a timing header for coordinate detection, and a coordinate detection carrier in the signal.
Figure 9B:
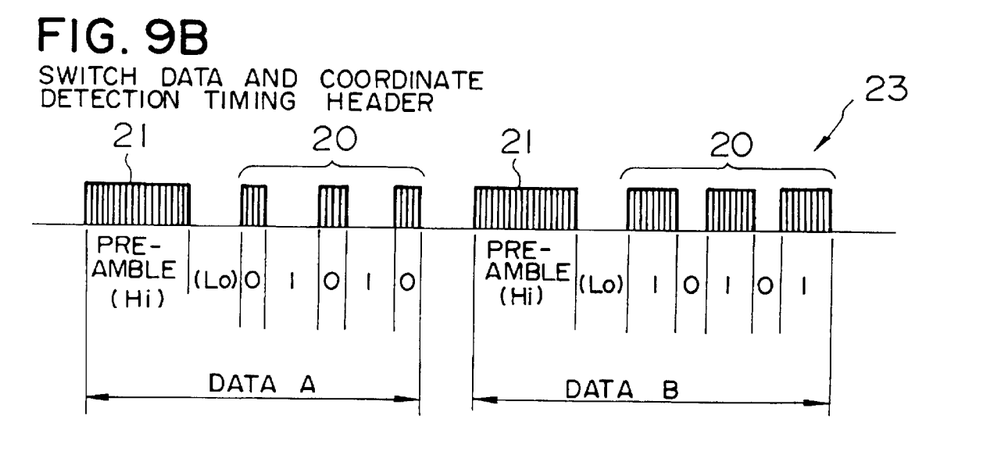
Figure 9C:
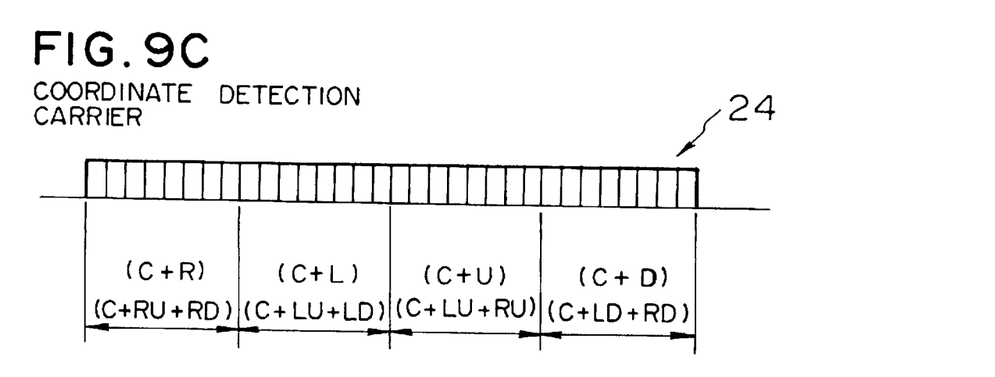
Figure 10:
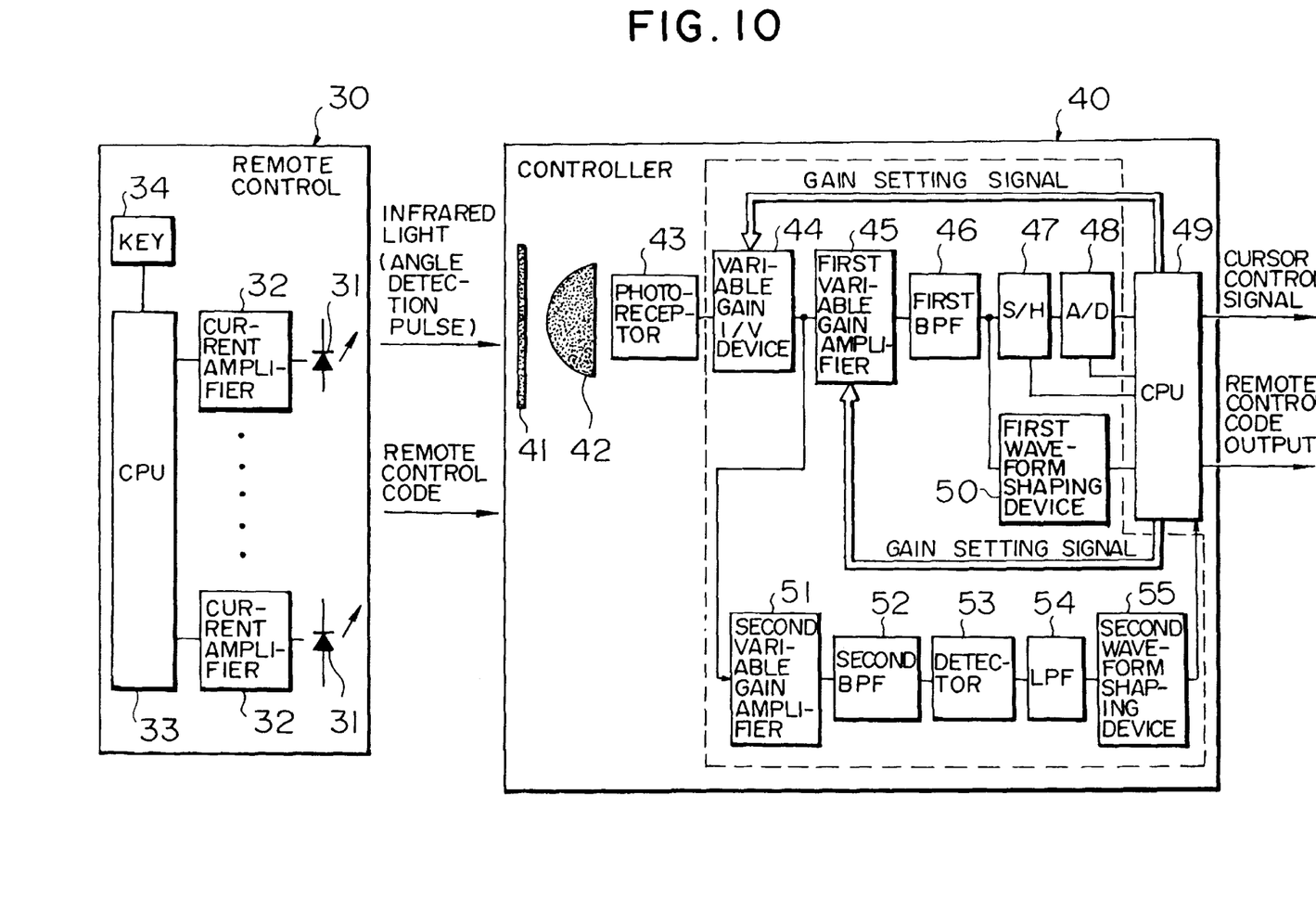
FIG. 10 is a block diagram showing the circuit configuration of the remote coordinate designating device according to the present invention.

FIG. 1 is an explanatory view showing the concept of a remote coordinate designating device according to the present invention, FIG. 2 is an explanatory view showing the principle of angle detection in the remote coordinate designating device, FIGS. 3A, 3B and 3C are respectively front, side and bottom views showing the arrangement of light emitting devices in a remote coordinate designating device according to a first embodiment of the present invention, FIG. 4 is a detection angle characteristic curve in a case in which half-value angles of the light emitting devices in the remote coordinate designating device are set almost similar to one another, FIG. 5 is an explanatory view showing the arrangement of light emitting devices in a remote coordinate designating device according to a second embodiment, FIGS. 6A, 6B and 6C are respectively front, side and bottom views showing the arrangement of light emitting devices in a remote coordinate designating device according to a third embodiment, FIG. 7 is a detection angle characteristic curve in a case in which the half-value angle of the center light emitting device is wider than that of other light emitting devices in the remote coordinate designating device, FIG. 8 is a detection angle characteristic curve in a case in which the half-value angle of the center light emitting device is narrower than that of other light emitting devices in the remote coordinate designating device, FIGS. 9A, 9B and 9C are waveform charts respectively showing the whole format of a signal from a remote control in the remote coordinate designating device of the present invention, switch data and a timing header for coordinate detection, and a coordinate detection carrier in the signal, and FIG. 10 is a block diagram showing the circuit configuration of the remote coordinate designating device.

In FIG. 1, numerals 1, 2, 3 and 4 denote a remote control, a monitor, a controller and a photoreceptor formed of a PIN photodiode, respectively.

Coordinate detection and signal transmission of the remote control 1 will now be described with reference to FIG. 1.

Carrier generation, which will be described later, is performed by the remote control 1, and angle detection is performed by the controller 3. An infrared ray is sent and received only in one direction from the remote control 1 to the controller 3. The remote control 1 has five light emitting diodes (LEDs). The controller 3 calculates the x and y coordinates of the remote control 1 based on the light intensity balance of the single photoreceptor 4 which has received the infrared ray from the remote control 1. The calculated x and y coordinates data is transmitted to the monitor 2 to move a cursor 5. The format of signals transmitted from the LEDs is shown in FIGS. 9A, 9B and 9C, and the signals are each normally composed of a carrier portion of 40 kHz for remote control and a carrier portion of 16 kHz which is lower than the normal remote control frequency.

First, the principle of angle detection in one axial direction (for example, x direction) will be described with reference to FIG. 2.

The x coordinate approximates an angle θ formed between the optical axis (shown by an alternate long and short dash line), which links the remote control 1 and the photoreceptor 4, and the center line of the remote control 1.

The present invention uses light fields of the LEDs. When an LED A is lighted up and then an LED B is lighted up, the amounts of light from the LEDs A and B in the photoreceptor 4 are detected as current values $I_A$ and $I_B$ on the optical axis as an observation point. A value obtained by using these current values and Expression (1) approximates the projected x coordinate.

$$x=((I_A-I_B)/(I_A+I_B)) \quad (1)$$

The coordinates in the x and y directions are detected by using this principle. As for the way to light the LED, unless the half-value angle is wide and the light intensity is high, a certain distance and a certain angle cannot be gained. The half-value angle means an angle at which the light intensity of the LED is halved, and the LED is not practicable unless the half-value angle is wide to some extent and the light intensity is high. However, the wide half-value angle and the high intensity are contrary to each other.

In other words, the light intensity is low when the half-value angle is wide. The present invention allows a light field, in which the half-value angle is wide and the light intensity is high, by combining LEDs, and will be described below.

A first embodiment of the present invention will be described with reference to FIGS. 3 and 4.

As shown in FIG. 3, five LEDs are arranged crosswise. In other words, there are provided a centered LED 10C, an LED 10U located above the LED 10C to point upward, an LED 10D located below the LED 10C to point downward, an LED 10R located on the right side of the LED 10C to point rightward, and an LED 10L located on the left side of the LED 10C to point leftward. These LEDs are lighted alternately.

As for the way to light the LEDs, for example, the LEDs are formed into pairs (10C+10R), (10C+10L), (10C+10U) and (10C+10D), and lighted alternately in these pairs. In other words, the LEDs 10C and 10R are simultaneously lighted for a predetermined time, the LEDs 10C and 10L are simultaneously lighted for a predetermined time, the LEDs 10C and 10U are simultaneously lighted for a predetermined time, and then, the LEDs 10C and 10D are simultaneously lighted for a predetermined time. This operation is repeated.

In such a case, the x coordinate is obtained from current values $I_{C+R}$ and $I_{C+L}$ of the pairs (10C+10R) and (10C+10L) at an observation point by using the above Expression (1). In short, $$x = k((I_{C+R} - I_{C+L})/(I_{C+R} + I_{C+L})) \qquad (2)$$

Furthermore, the y coordinate is obtained from current values $I_{C+U}$ and $I_{C+D}$ of the pairs (10C+10U) and (10C+10D) at an observation point by using the above Expression (1). In short, $$y = k((I_{C+U} - I_{C+D})/(I_{C+U} + I_{C+D})) \qquad (3)$$

A tilt angle β of the LEDs 10U, 10D, 10R and 10L is set almost similar to the half-value angle thereof.

FIG. 4 is a detection angle characteristic curve of this embodiment. In this characteristic curve, the horizontal axis indicates a deviation angle θ of the remote control 1, and the vertical axis indicates the specification value obtained when the maximum value given by the expression (2) or (3) is 1. In short, a specification value 0 shows that the light amounts of the right and left LEDs are the same. As this chart reveals, the characteristic curve rises smoothly and monotonously. In other words, the slope and linearity of the curve can be adjusted by the light intensity and mounting angle of the LEDs. The slope becomes gentle as the mounting angle increases, and the curve comes to erect itself as the mounting angle decreases. When the use angle of the remote control 1 is within a range of ±15°, the curve is almost straight as shown in the characteristic curve of FIG. 4.

If it is assumed that a general type of television screen measures 20 to 50 inches diagonally, a person usually watches the television at a distance of 2 m to 3 m, and the angle at which he points the remote control 1 to the screen at that position is about ±10° to 15°. Furthermore, the remote control 1 is easy to operate at ±15° from the viewpoint of human engineering. Therefore, the remote control 1 is operated at this degree of angle in many cases.

Although the tilt angle of the LEDs is set almost similar to the above-mentioned half-value angle thereof in the above description, variations occur in the half-value angles of the LEDs. It is difficult from the viewpoint of cost to eliminate these variations. However, when there are variations in the half-value angles of the LEDs, even if they are small, the characteristic curve changes its shape to a curve having windings as shown in FIG. 7, and the cursor 5 on the monitor 2 moves in a curve even if the remote control 1 is moved straight. In particular, this is outstanding on the peripheral portion of the monitor screen.

In a case in which the half-value angle of the center LED 10C is wider than other LEDs due to the variations, that is, in a case in which the field of the center LED 10C is wider, windings arise as shown in FIG. 7, which lowers linearity.

Although this lowering can be prevented by adjusting the linearity by the light intensity and mounting angle of the LEDs, the linearity can be enhanced by using the remote control 1 in a range where no extreme value arises in the detection angle characteristic. This enhancement will be described below with reference to FIG. 8.

In this example, the half-value angle of the center LED 10C is narrow, and the half-value angle of other LEDs is wide. At this time, in consideration of variations in the LEDs, setting is so made that the half-value angle of the center LED 10C is certainly smaller than that of other LEDs regardless of the variations in the LEDs.

In short, the half-value angles of light patterns of the respective LEDs are set as follows.

$$LH_C \leq LH_R, LH_L \text{ and } LH_C \leq LH_U, LH_D$$

wherein LH indicates the half-value angle of the light pattern of the LED, and subscripts C, R, L, U and D respectively represent five, center, right, left, upper and lower, LEDs.

The detection angle characteristic that satisfies the above expression offers a sigmoidal characteristic, where an extreme value arises out of the use angle range, as shown in FIG. 8. In this case, the characteristic gives a straight line without any windings at angles θx in the range of ±15°, and therefore, good linearity is obtained by using these angles. Although the angle θx has two values for one specification value (outputs from the photoreceptor are the same), it is determined by software processing which angle to select. Although, for example, the increase of the value $I_C + I_R$ and the decrease of the value $I_C + I_L$ shows that the remote control 1 is tilted to the left, either of two angles θx can be also selected based on the increase or decrease of the specification value. A light pattern having the half-value angle, that satisfies the above expression, can be obtained reliably by sorting of the LEDs and addition of a lens cap in front of each LED.

Next, a second embodiment of the present invention will be described with reference to FIG. 5. The same components as those in the above-mentioned embodiment are denoted by the same numerals, and a detailed description thereof is omitted.

In the second embodiment, as shown in FIG. 5, LEDs 10U, 10D, 10C, 10R and 10L are arranged in a line in order from the left (this arrangement is referred to as "linearly independent angle type"). Such arrangement of the LEDs in a line can make the remote control 1 thinner. The way to light the LEDs in this embodiment is similar to the above-mentioned first embodiment.

Next, a third embodiment of the present invention will be described with reference to FIGS. 6A, 6B and 6C. The same components as those in the above-mentioned embodiments are denoted by the same numerals, and a detailed description thereof is omitted.

In this third embodiment, an LED 10C is centered and LEDs 10LU, 10LD, 10RU and 10RD are arranged in slanting directions as shown in FIG. 6.

As for the way to light the LEDs in the third embodiment, the LEDs are divided into groups of three each, (10C+10LU+10LD), (10C+10RU+10RD), (10C+10LU+10RU) and (10C+10LD+10RD), and lighted alternately in these groups. In other words, the LEDs 10C, 10LU and 10LD are lighted simultaneously for a predetermined time, the LEDs 10C, 10RU and 10RD are lighted simultaneously for a predetermined time, the LEDs 10C, 10LU and 10RU are lighted simultaneously for a predetermined time, and then, the LEDs 10C, 10LD and 10RD are lighted simultaneously for a predetermined time. This operation is repeated.

In such a case, the x coordinate is obtained from current values $I_{C+LU+LD}$ and $I_{C+RU+RD}$ of the groups (10C+10LU+10LD) and (10C+10RU+10RD) at an observation point by using the above Expression (1).

In short, $$x=k((I_{C+LU+LD}-I_{C+RU+RD})/(I_{C+LU+LD}+I_{C+RU+RD})) \qquad (4)$$

The y coordinate is obtained from current values $I_{C+LU+RU}$ and $I_{C+LD+RD}$ of the groups (10C+10LU+10RU) and (10C+10LD+10RD) at an observation point by using the above Expression (1).

In short, $$y=k((I_{C+LU+RU}-I_{C+LD+RD})/(I_{C+LU+RU}+I_{C+LD+RD})) \qquad (5)$$

The arrangement of the LEDs shown in FIG. 6 makes it possible to widen the light pattern field and to further widen the detectable area and the detection angle range.

Next, description will be given to a light signal with reference to FIGS. 9A, 9B and 9C.

FIGS. 9A, 9B and 9C are explanatory views respectively showing the format of a signal from the remote control, switch data and a coordinate detection timing header in the signal format, and a coordinate detection carrier in the signal format. This signal format corresponds to the above-mentioned first to third embodiments.

As described above, the controller 3 receives infrared light emitted from the remote control 1, and detects the angle of the light and the like in this embodiment. A light signal emitted from the remote control 1 will be described below.

The light signal is sent from the remote control 1 in the format which comprises two patterns as one unit (one cycle) as shown in FIG. 9A. One of the patterns includes switch data 20 and a timing header 21 for coordinate detection in a switch data portion 23 shown in FIG. 9B, and the other includes a coordinate detection carrier 24 shown in FIG. 9C. The switch data 20 and the coordinate detection timing header 21 are first sent, and then, the coordinate detection carrier 24 is sent.

First, the switch data 20 and the coordinate detection timing header 21 shown in FIG. 9B will be described.

The remote control 1 has a switch for pointing only like, for example, right and left buttons and selection and cancel switches of a mouse. On-off information for the switch is contained in the switch data 20.

The switch data 20 and the coordinate detection timing header 21 are also used as a timing header. The time is measured from the rise of the first burst portion shown in FIG. 9B. On the other hand, the time taken from the rise of the first burst portion to the rise of the coordinate detection carrier is fixed in the controller. Therefore, the coordinate detection is started when the fixed time has passed from the rise of the first burst portion. Thus, the switch data 20 and the timing header 21 also serve as a timing header.

Furthermore, the switch data 20 and the coordinate detection timing header 21 form Data A and Data B as shown in FIG. 9B. Although Data A and Data B are the same in contents, they are reverse to each other. A signal '0' in Data A is reversed into a signal '1' in Data B, and a signal '1' in Data A is reversed into a signal '0' in Data B. This enhances the accuracy of data. In other words, if a data error arises somewhere, the sum of values in Data A and Data B does not achieve parity. When Data A and Data B agree with each other in information contents, the detection of position coordinates is started. Such a verifying function is given by adding and sending reversed signals.

The coordinate detection carrier 24 is a timing signal which shows the lighting of the LEDs, arranged in the center, right, left, upper and lower positions, in separate four light fields as mentioned above, and the controller 3 previously stores the four-period split lighting order therein. In other words, the LEDs 10C and 10R are lighted simultaneously for a predetermined time in a period (C+R) of the coordinate detection carrier 24, and then, the LEDs 10C and 10L are lighted simultaneously for a predetermined time in a period (C+L). Subsequently, the LEDs 10C and 10U are lighted in a period (C+U), and the LEDs 10C and 10D are lighted in a period (C+D). In the third embodiment, the LEDs are lighted in the order of periods (C+RU+RD), (C+LU+LD), (C+LU+RU) and (C+LD+RD).

As the frequency for the switch data and the coordinate detection timing header, what is called a normal remote control frequency band is used, and the coordinate detection carrier uses a lower frequency than the normal remote control frequency.

Next, the configuration of the remote coordinate designating device will be described with reference to FIG. 10.

Referring to FIG. 10, a plurality of light emitting diodes (LEDs) 31 and 31 are arranged in a remote control 30, and connected to a CPU 33 through current amplifiers 32 and 32. A key 34 provided in the remote control 30 is also connected to the CPU 33. When the key 34 is operated to switch on the remote coordinate designating device, infrared light (angle detection pulse) is transmitted from the LEDs 31 in the above-mentioned signal format which is controlled by the CPU 33. Furthermore, a remote control code is also transmitted from the LED 31 by using pushbutton switches provided in the remote control 30 to control the channel, volume and the like of a television.

A controller 40 comprises a visible light cut filter 41 for receiving the signals transmitted from the LED 31, a lens 42, a photoreceptor 43, a variable gain I/V device 44, a first variable gain amplifier 45, a first bandpass filter (BPF) 46, a sample and hold circuit (S/H) 47, an analog-to-digital (A/D) converter 48, a CPU 49, a first waveform shaping device 50, a second variable gain amplifier 51, a second bandpass filter (BPF) 52, a detector 53, a low-pass filter (LPF) 54, and a second waveform shaping device 55.

Next, the operation of the remote coordinate designating device will be described.

A signal in the format shown in FIG. 9 is transmitted from the LED 31 of the remote control 30. The switch data 20 and the timing header 21 at the head uses the normal remote control frequency.

First, the signal is passed through the visible light cut filter 41, condensed by the lens 42, and received by the photoreceptor 43, by which the signal is proportionally converted into a current value depending on the light intensity. This current is converted into voltage by the variable gain I/V device 44. The voltage detected in the previous event is stored in the CPU 49, and fed back at the gain corresponding thereto. This feedback changes a gain setting of the variable gain I/V device 44, and the gain is changed depending on the intensity of light received by the photoreceptor 43.

The signal corresponding to the switch data 20 and the timing header 21 at the head of the format of the signal from the remote control 30 passes through the variable gain I/V device 44, and then, enters the second variable gain amplifier 51. The second variable gain amplifier 51 detects the output signal for itself and brings it to a fixed level. Only a carrier of the remote control frequency band is taken out by the second bandpass filter 52, detected by the detector 53, and passed through the low-pass filter 54 and the second waveform shaping device 55, by which data output corresponding to the switch data and the coordinate detection timing header can be produced.

The output from the second waveform shaping device 55 is received by the CPU 49, the above-mentioned verification is completed, and the above coordinate detection carrier 24 is sent when a predetermined time has passed from the rise of the first burst portion.

The coordinate detection carrier 24 sent from the remote control 30 is also passed through the visible light cut filter 41, condensed by the lens 42, received and proportionally converted into a current value depending on the light intensity by the photoreceptor 43. This current is converted into voltage by the variable gain I/V device 44. The output of the variable gain I/V device 44 enters the first variable gain amplifier 45, and then, passes through the first bandpass filter 46. Since the first bandpass filter 46 is a bandpass filter corresponding to the frequency of the coordinate detection carrier, only the coordinate detection carrier is passed through the first bandpass filter 46, and input to the sample and hold circuit 47 and the analog-to-digital converter 48. The output of the analog-to-digital converter 48 enters the CPU 49. The signal passed through the first bandpass filter 46 has a sinusoidal waveform, and a peak value and a bottom value thereof are detected and held by the sample and hold circuit 47. To discriminate between the peak value and the bottom value, the first waveform shaping device 50 converts the sinusoidal wave into a rectangular wave, and the CPU 49 determines the peak-to-bottom time by timing the rise and fall of the wave, and gives a sample and hold instruction to the sample and hold circuit 47.

The CPU 49 functions as a control device in the controller 40, and also functions as an arithmetic device for calculating coordinate information sent from the remote control 30 to the controller 40 based on the input of the timing header and the received light output. The CPU 49 outputs this coordinate information to the monitor to control the movement of the cursor. Furthermore, when the switch data contains pointing switch-on information, the CPU 49 outputs the information to the monitor, thereby controlling the switching of the monitor screen and the like.

Next, the receiving of the remote control code will be described.

When the pushbutton switch for selecting the channel number or adjusting the volume of the television is operated, the remote control 30 transmits a signal from the LED 31 in the format of infrared light corresponding to the pushbutton switch in the same manner as a general type of remote control. This signal is processed through the second variable gain amplifier 51, the second bandpass filter 52, the detector 53 and the like, and input to the CPU 49 in the same manner as the above-mentioned process of the switch data 20 and the timing header 21. The CPU 49 outputs the remote control code corresponding to the pushbutton switch to the monitor, thereby controlling the switching between the monitor channels and the like.

The normal remote control signal may be also processed by a processing circuit for remote control provided in the television or the like as a monitor.

According to the invention claimed in claim 1, since the accuracy of data transmitted from the remote control can be enhanced, there is no possibility of an erroneous operation, and operability is improved.

According to the invention claimed in claims 2 and 3, the coordinate position of the remote control can be detected reliably even though a plurality of transmission modes are used.

Furthermore, according to the invention claimed in claims 4, 5 and 6, since the half-value angle of the light pattern is wide and the light intensity is high, the usable area and the detection angle range can be made wide.

Still further, according to the invention claimed in claims 7 and 8, since no winding arises in the detection angle characteristic curve at a use angle normally used by an operator even if there are variations in light patterns of light emitting devices, good linearity of the cursor movement in response to the movement of the remote control can be maintained, the yield of products is enhanced, and operability is also enhanced.

What is claimed is:

1. A remote coordinate designating device, comprising:
   a remote control having a light emitting device for emitting light; and
   a controller for detecting a designated position by receiving light from said remote control at a distance from said remote control,
   wherein one cycle of a light signal from said light emitting device is composed of switch data and a coordinate detection timing header at the head, and a coordinate detection carrier, said switch data and said coordinate detection timing header use the same frequency as the normal remote control frequency band, the frequency of said coordinate detection carrier is lower than the frequency of said switch data and said coordinate detection timing header, said switch data contains on-off information about a switch for pointing, and coordinate detection is started when a predetermined time has passed from the rise of a burst portion in said switch data.

2. A remote coordinate designating device, comprising:
   a remote control having a light emitting device for emitting light; and
   a controller for detecting a designated position by receiving light from said remote control at a distance from said remote control,
   wherein said remote control comprises a center light emitting device located in the center, and an upper, lower, right and left light emitting devices arranged around said center light emitting device and tilted in such directions that the optical axes thereof extend away from said center light emitting device,
   wherein said center light emitting device and said right light emitting device are paired, said center light emitting device and said left light emitting device are paired, said center light emitting device and said upper light emitting device are paired, and said center light emitting device and said lower light emitting device are paired, such that said pairs of light emitting devices are illuminated alternatively.

3. A remote coordinate designating device according to claim 2, wherein said right, left, upper and lower light emitting devices are arranged in about one line centered with respect to said center light emitting device.

4. A remote coordinate designating device of claim 2, wherein a half-value angle of said center light emitting device is equal to or smaller than a half-value angle of said right, left, upper, or lower light emitting device.

5. A remote control coordinate designating device, comprising:

a light emitting device for emitting an angle detection signal and a remote control code signal, a first circuit for processing said angle detection signal, said first circuit comprises a photoreceptor for converting said angle detection signal into a current value, a variable gain device coupled to said photoreceptor for converting said current value into a voltage, a variable gain amplifier coupled to said variable gain device for receiving said voltage, and a first bandpass filter coupled to said variable gain amplifier for allowing only a coordinate detection carrier signal to be passed to a central processing unit, and a second circuit for processing said remote control signal, said second circuit comprises an automatic gain control amplifier for receiving a switch data and a coordinate detection timing header signal, a second bandpass filter coupled to said automatic gain control amplifier for filtering a remote control code, a detector coupled to said second bandpass filter for detecting said remote control code and passing said remote control code to a low-pass filter, a waveform shaping device coupled to said low pass filter for receiving said remote control code and producing an output data which is received by said central processing unit.

* * * * *